(12) United States Patent
Furuie et al.

(10) Patent No.: US 9,147,717 B2
(45) Date of Patent: Sep. 29, 2015

(54) ORGANIC DISPLAY DEVICE HAVING A CONTACT HOLE PLANARIZATION FILM MADE OF AN ORGANIC INSULATING MATERIAL

(71) Applicant: Japan Display Inc., Tokyo (JP)

(72) Inventors: Masamitsu Furuie, Tokyo (JP); Toshihiro Sato, Tokyo (JP); Mitsuhide Miyamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/463,696

(22) Filed: Aug. 20, 2014

(65) Prior Publication Data

US 2015/0053955 A1 Feb. 26, 2015

(30) Foreign Application Priority Data

Aug. 21, 2013 (JP) .................................. 2013-171765

(51) Int. Cl.
| | | |
|---|---|---|
| *H01L 29/08* | (2006.01) | |
| *H01L 27/14* | (2006.01) | |
| *H01L 27/15* | (2006.01) | |
| *H01L 27/12* | (2006.01) | |
| *H01L 27/32* | (2006.01) | |

(52) U.S. Cl.
CPC ................................ *H01L 27/3248* (2013.01)

(58) Field of Classification Search
CPC . H01L 27/12; H01L 27/1248; H01L 27/3246; H01L 51/5206; H01L 51/0023; H01L 2251/5315
USPC ............... 257/40, 79, 72, 347, 59; 438/42, 99
See application file for complete search history.

(56) References Cited

U.S. PATENT DOCUMENTS

| | | | | |
|---|---|---|---|---|
| 5,877,832 | A * | 3/1999 | Shimada ........................ | 349/138 |
| 6,002,462 | A * | 12/1999 | Sato et al. ...................... | 349/106 |
| 6,856,360 | B1 * | 2/2005 | Higuchi et al. ................. | 349/43 |
| 2001/0019133 | A1 | 9/2001 | Konuma et al. | |
| 2004/0178725 | A1 * | 9/2004 | Karasawa et al. ............. | 313/506 |
| 2005/0082534 | A1 * | 4/2005 | Kim et al. ....................... | 257/72 |
| 2005/0093438 | A1 * | 5/2005 | Chen .............................. | 313/506 |
| 2005/0110021 | A1 * | 5/2005 | Park et al. ....................... | 257/72 |
| 2007/0111369 | A1 * | 5/2007 | Chun et al. ..................... | 438/99 |

FOREIGN PATENT DOCUMENTS

| | | |
|---|---|---|
| JP | 2001-312223 A | 11/2001 |
| JP | 2003-91246 A | 3/2003 |
| JP | 2009-301058 A | 12/2009 |

* cited by examiner

*Primary Examiner* — Long K Tran
*Assistant Examiner* — Dzung Tran
(74) *Attorney, Agent, or Firm* — Lowe Hauptman & Ham, LLP

(57) ABSTRACT

An organic EL display device includes: thin film transistors that are arranged in respective pixels within a display area which are arranged in a matrix; a planarization film that is formed over the thin film transistor and made of an organic insulating material; contact electrodes that are connected to drains or sources of the respective thin film transistors through contact holes formed within the planarization film; contact hole planarization films that are arranged over the respective contact electrodes with which the contact holes are embedded, and made of an organic insulating material; a lower electrode that is formed to be electrically connected onto the contact electrodes, and formed over the contact hole planarization film; and an organic layer that is arranged over the lower electrode to cover the overall display area, and formed of a plurality of organic material layers including a light emitting layer.

12 Claims, 18 Drawing Sheets

ORGANIC DISPLAY DEVICE HAVING A CONTACT HOLE PLANARIZATION FILM MADE OF AN ORGANIC INSULATING MATERIAL

CROSS-REFERENCE TO RELATED APPLICATION

The present application claims priority from Japanese application JP2013-171765 filed on Aug. 21, 2013, the content of which is hereby incorporated by reference into this application.

BACKGROUND OF THE INVENTION

1. Field of the Invention

The present invention relates to an organic EL display device.

2. Description of the Related Art

In recent years, an image display device (hereinafter referred to as "organic EL (electro luminescent) display device") using self-luminous bodies called "organic light emitting diodes" has been input into practical use. As compared with a conventional liquid crystal display device, the organic EL display device not only is excellent in visibility and response speed, but also requires no auxiliary lighting device such as a backlight because of the use of the self-luminous bodies. Therefore, the organic EL display device can be further thinned.

As a method of conducting color display in the organic EL display device of this type, there are a method in which a light emitting element emits light of three colors of R(red), G(green), and B (blue) for each of pixels, a method in which the light emitting element emits light of white, and color filters in each pixel transmit respective wavelength ranges of three colors of RGB, and a method in which those methods are combined together.

JP 2001-312223 A discloses that in order to form an organic EL material with a uniform film thickness, electrode holes are embedded with an organic resin material to form a protective portion. JP 2003-091246 A discloses that contact hole portions are covered with and smoothed by an insulator layer or a conductor layer to uniform the thickness of the organic EL layer, against the same problem as that in JP 2001-312223 A. JP 2009-301058 A discloses that contact holes are embedded with a conductor, and the conductor is brought into contact with metal films which are electrodes from the viewpoint of such a problem that an area in which TFTs and lines are formed does not transmit light.

SUMMARY OF THE INVENTION

In the organic EL display device, a contact hole for connecting a TFT (thin film transistor) of each pixel to a lower electrode of a light emitting element is formed in each pixel. However, the contact hole has a large step, and the light emitting element cannot be normally formed. Therefore, because the light emitting area is configured by an area except for the contact hole, a light emitting area in each pixel is reduced. JP 2009-301058 A discloses an example in which the light emitting area is enlarged, but there is a risk that an electric connection is insufficient because an anisotropic conductive film in which silver particles are dispersed in acrylic is used as a conducting unit.

The present invention has been made in view of the above-mentioned circumstances, and therefore an object of the present invention is to provide an organic EL display device in which an electric connection is sufficient, and a light emitting area in each pixel is enlarged.

According to the present invention, there is provided an organic EL display device, including: thin film transistors that are arranged in respective pixels within a display area which are arranged in a matrix; a planarization film that is formed over the thin film transistor and made of an organic insulating material; contact electrodes that are connected to drains or sources of the respective thin film transistors through contact holes formed within the planarization film, and made of a conductive material; contact hole planarization films that are arranged over the respective contact electrodes with which the contact holes are embedded, and made of an organic insulating material; a lower electrode that is formed to be electrically connected onto the contact electrodes, and formed over the contact hole planarization films; an organic layer that is arranged over the lower electrode to cover the overall display area, and formed of a plurality of organic material layers including a light emitting layer that emits light; and an upper electrode that is formed over the organic layer, arranged to cover the overall display area, and made of a conductive material.

Also, in the organic EL display device according to the present invention, the contact hole planarization film may come in contact with an organic material that is present outside of the contact holes.

Also, in the organic EL display device according to the present invention, the contact hole planarization film may come in contact with the organic planarization film.

Also, the organic EL display device according to the present invention may further include a pixel separation film that covers an end of the lower electrode, is arranged between the respective pixels, and made of an organic insulating material, in which the contact hole planarization film comes in contact with the pixel separation film.

Also, in the organic EL display device according to the present invention, the lower electrode may include a reflective film that is formed on the contact hole planarization film, and reflects light emitted by the light emitting layer; and a transparent electrode film that is formed over the reflective film, and made of a transparent conductive material.

Also, in the organic EL display device according to the present invention, each of the contact holes may be coupled with the contact holes of the adjacent pixels, and the contact hole planarization film may be integrated with the contact hole planarization films of the adjacent pixels.

Also, in the organic EL display device according to the present invention, each of the contact holes may further include control signal lines that extend along between the pixels in which the coupled contact holes are formed, in which the control signal lines may be arranged at positions that come out of contact with the planarization film.

DETAILED DESCRIPTION OF THE INVENTION

Figure 1:
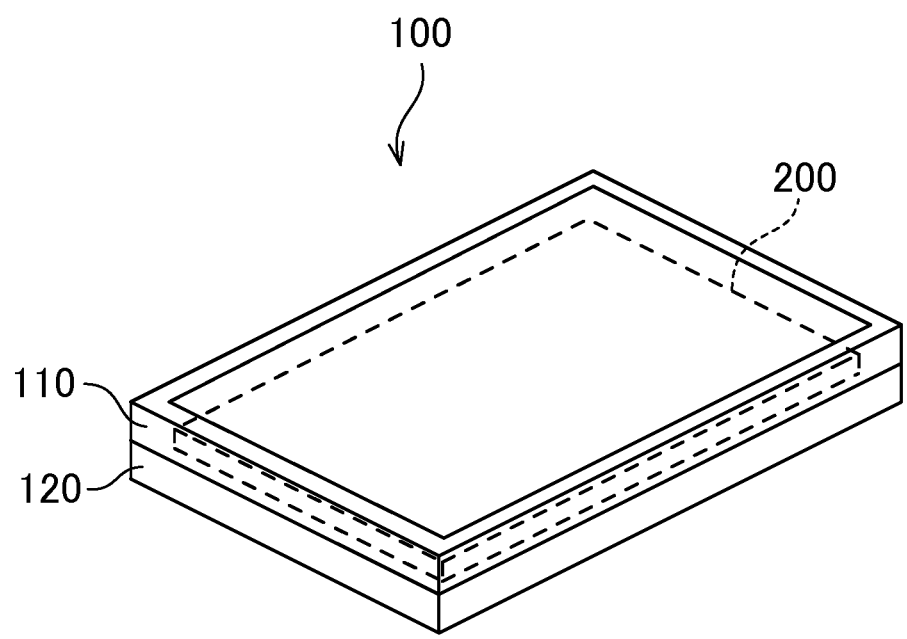
FIG. 1 is a diagram schematically illustrating an organic EL display device according to a first embodiment of the present invention.

Hereinafter, embodiments of the present invention will be described with reference to the accompanying drawings. In the drawings, identical or equivalent elements are denoted by identical symbols, and a repetitive description will be omitted.

(First Embodiment)

FIG. 1 is a diagram schematically illustrating an organic EL display device 100 according to a first embodiment of the present invention. As illustrated in FIG. 1, the organic EL display device 100 includes an organic EL panel 200 fixedly held between an upper frame 110 and a lower frame 120.

Figure 2:
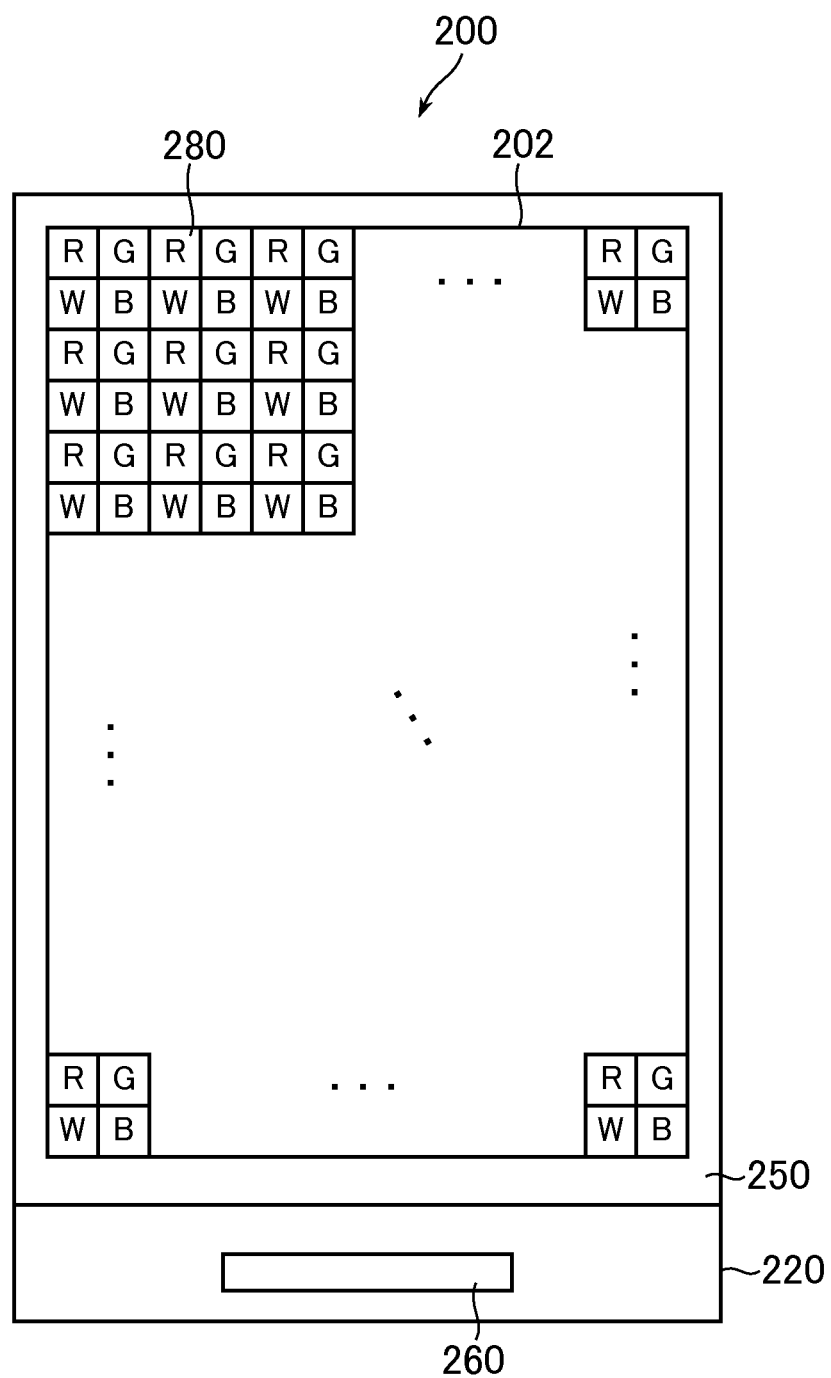
FIG. 2 is a diagram illustrating a configuration of an organic EL panel in FIG. 1.

FIG. 2 is a diagram illustrating a configuration of the organic EL panel 200 in FIG. 1. The organic EL panel 200 includes two substrates of a TFT (thin film transistor) substrate 220 and a sealing substrate 250, and a space between those substrates 220 and 250 is filled with a transparent resin 241 (refer to FIG. 5). The TFT substrate 220 includes sub-pixels 280 which are arranged in a matrix in a display area 202. Also, a drive IC (integrated circuit) 260 which is a driver circuit that applies a potential for conducting between a source and a drain of a pixel transistor is applied to a scanning signal line (not shown) of the pixel transistor arranged in each of the sub-pixels 280, and also applies a voltage corresponding to a gray scale value of a pixel to a data signal line of each pixel transistor is mounted on the TFT substrate 220. Also, in this embodiment, one pixel is configured by the combination of four sub-pixels 280 to which respective four colors of R (red), G (green), B (blue), and W (white) are allocated. Each of the sub-pixels 280 has an OLED (organic light emitting diode) that emits a white light, and emits a light having a wavelength range corresponding to each color with the use of a color filter corresponding to each color.

Figure 3:
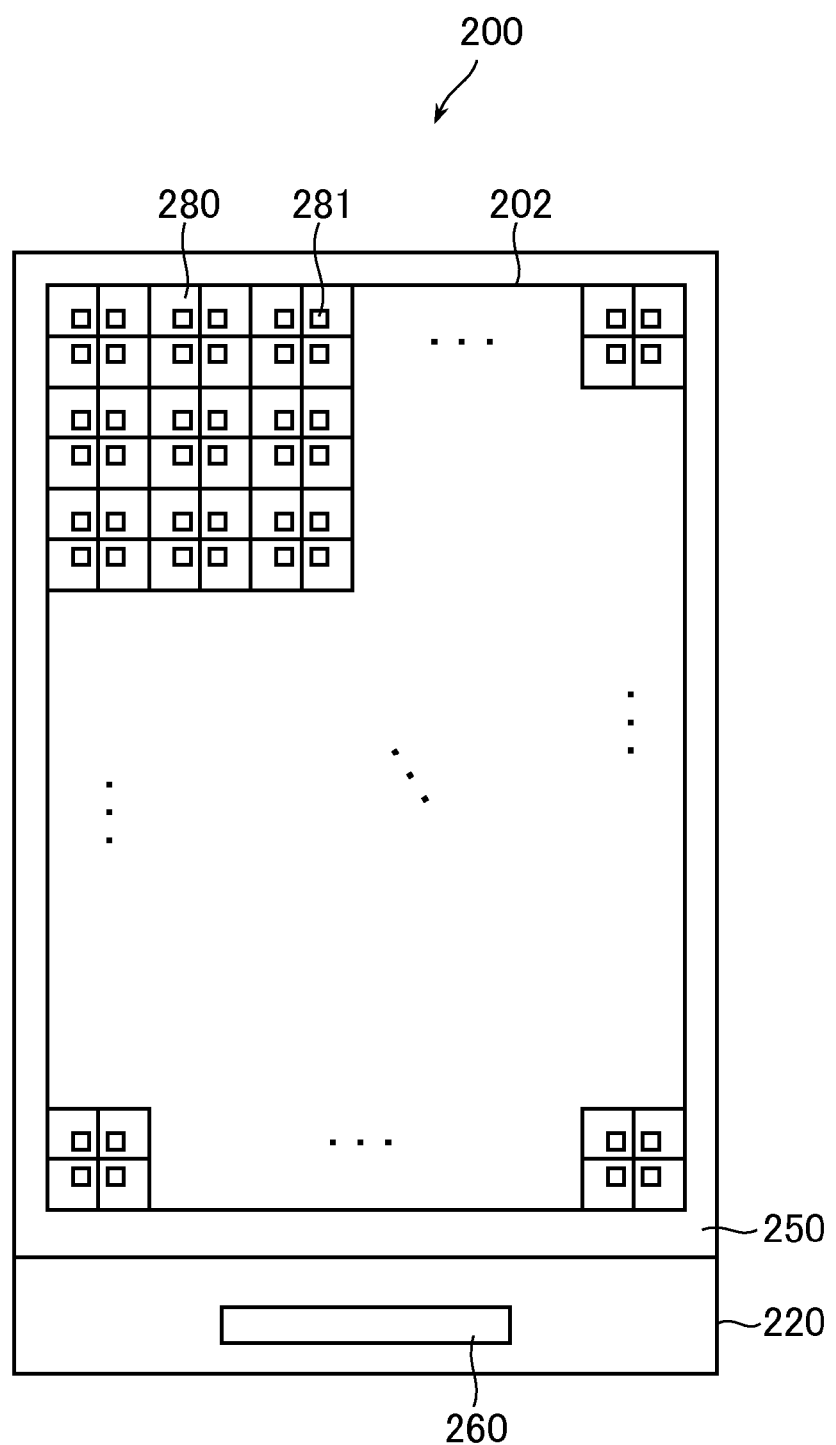
FIG. 3 is a diagram illustrating positions of contact holes in respective sub-pixels illustrated in FIG. 2.

FIG. 3 is a diagram illustrating positions of contact holes 281 in the respective sub-pixels 280 illustrated in FIG. 2. The contact holes 281 are each configured to electrically connect a source/drain electrode 223 (to be described later) of the transistor to an electrode which leads to a light emitting layer of the pixel. As illustrated in FIG. 3, the contact hole 281 of each sub-pixel 280 is arranged at a position close to an intersection point of boundary lines of the respective sub-pixels 280 in the pixel having four sub-pixels 280 combined together.

Figure 4:
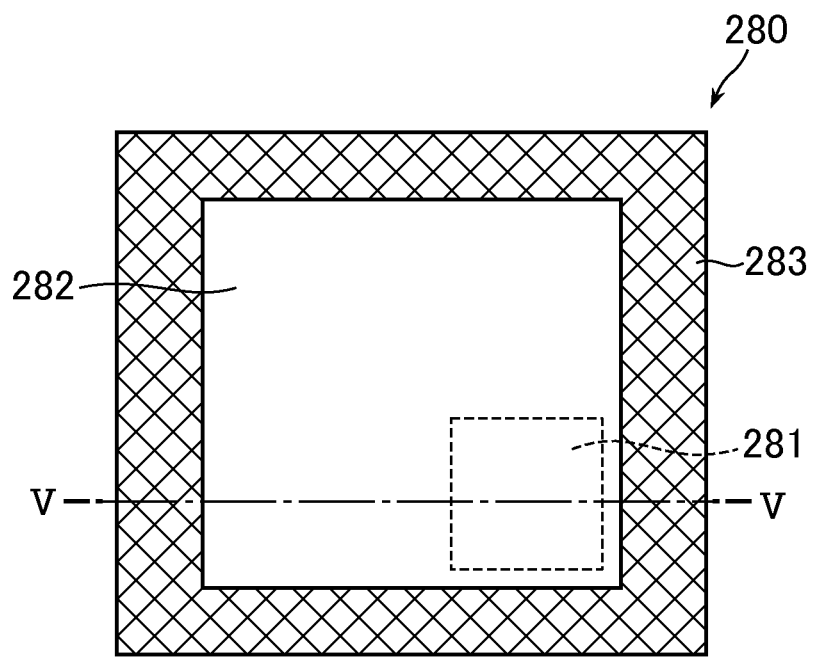
FIG. 4 is a plan view illustrating one of the sub-pixels in FIG. 2, which shows a light emitting area and a black matrix which is a light shielding area.

FIG. 4 is a plan view illustrating one of the sub-pixels 280 in FIG. 2, which shows a light emitting area 282 and a black matrix 283 which is a light shielding area. The light emitting area 282 is formed inside along an outline that determines a shape of the sub-pixel 280, and the black matrix 283 surrounds a periphery of the light emitting area 282.

Figure 5:
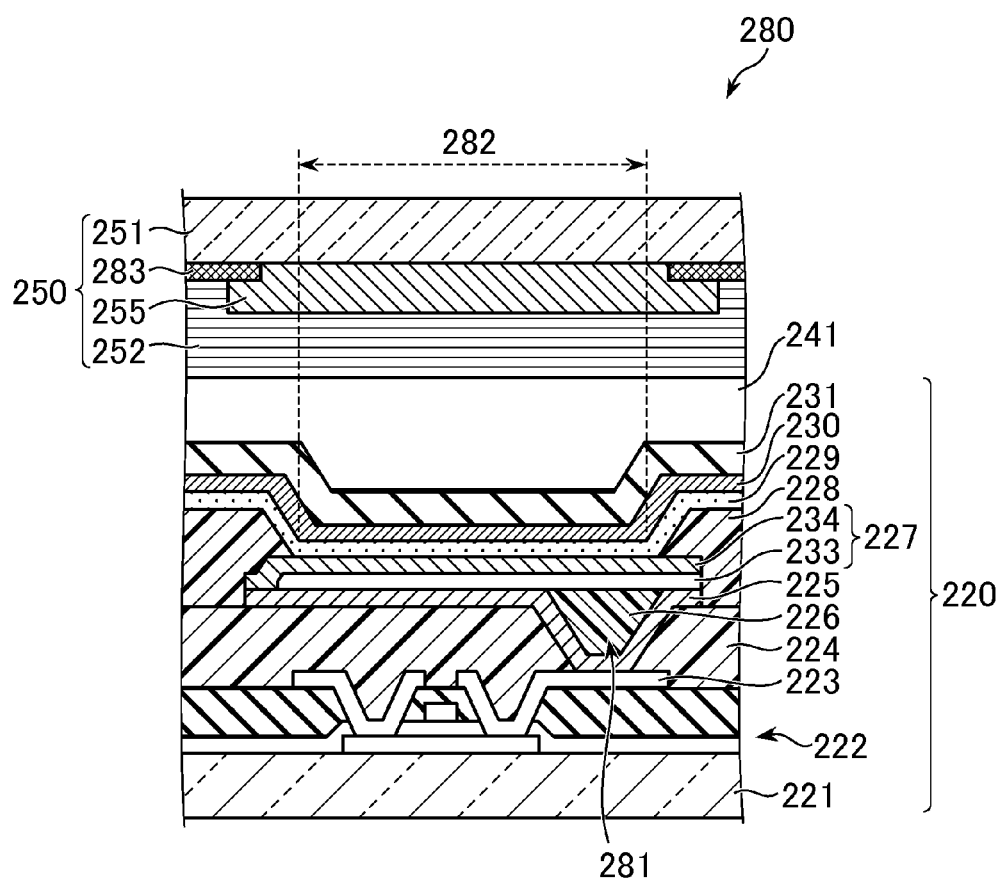
FIG. 5 is a cross-sectional view taken along a line V-V in FIG. 4, which shows a structure of each sub-pixel.

FIG. 5 is a cross-sectional view taken along a line V-V in FIG. 4, which shows a structure of each sub-pixel 280. As illustrated in FIG. 5, the sealing substrate 250 and the TFT substrate 220 adhere to each other through a transparent resin 241. The sealing substrate 250 includes a transparent insulating substrate 251 such as a glass substrate or a plastic substrate, the black matrix 283 which is a light shielding film that shields the light emitted between the adjacent sub-pixels 280, a color filter 255 that transmits a light of the wavelength range corresponding to each color in the pixel of particularly the RGB colors, and an overcoat layer 252 that is a protective film formed on the color filter 255 to cover the overall display area of the sealing substrate 250.

Also, the TFT substrate 220 includes a transparent insulating substrate 221 such as a glass substrate or a plastic substrate, a semiconductor circuit layer 222 which is a circuit for controlling the light emission of the respective sub-pixels 280 formed on the transparent insulating substrate 221 in which a transistor is formed of a known semiconductor such as an LIPS (low-temperature polysilicon) semiconductor, an amorphous semiconductor, or an oxide semiconductor, the source/drain electrode 223 which is one electrode of the transistor, and a planarization film 224 that is made of an organic insulating material. The TFT substrate 220 also includes a contact electrode 225 that is connected to the source/drain electrode 223 of the transistor through the contact hole 281 which is an opening formed in the planarization film 224, a contact hole planarization film 226 that is formed on the contact electrode 225 of the contact hole 281 so as to embed the contact hole 281 therewith, and a lower electrode 227 that is formed on the contact electrode 225 and the contact hole planarization film 226. The TFT substrate 220 further includes a pixel separation film 228 that covers an end of the lower electrode 227, and made of an organic insulating material between the respective pixels, and an organic layer 229 that is formed on the lower electrode 227 and the pixel separation film 228 so as to cover the overall display area, and formed of a light emitting layer that emits the white light, an electron injection layer, and a hole transport layer. The TFT substrate 220 further includes an upper electrode 230 that is formed to cover the organic layer 229, and made of a transparent conductive material such as ITO (indium tin oxide) or IZO (indium zinc oxide), and a sealing film 231 that is formed on the upper electrode 230, and made of an inorganic insulating material such as SiO or SiN.

In this example, the lower electrode 227 includes a reflective film 233 which is formed of a reflection metal such as Ag, and a transparent electrode film 234 that is formed on a reflective film 233, and made of a conductor such as ITO, IZO, or Ag which is transparent or transmits a light. The transparent electrode film 234 comes in direct contact with a part of the contact electrode 225 to enhance the conductivity. Also, the light emitting area 282 is defined by an area in which the lower electrode 227 comes in contact with the organic layer 229.

As described above, the contact hole planarization film 226 is formed within the contact hole 281, and the lower electrode 227 comes in contact with a sufficient area of the contact electrode 225, and is also formed on the contact hole 281. With this configuration, as illustrated in FIG. 4, the light emitting area 282 can be also formed on the contact hole 281. As a result, the organic EL display device 100 can be provided in which the electric connection is sufficient, and the light emitting area in each pixel is enlarged.

Figure 6:
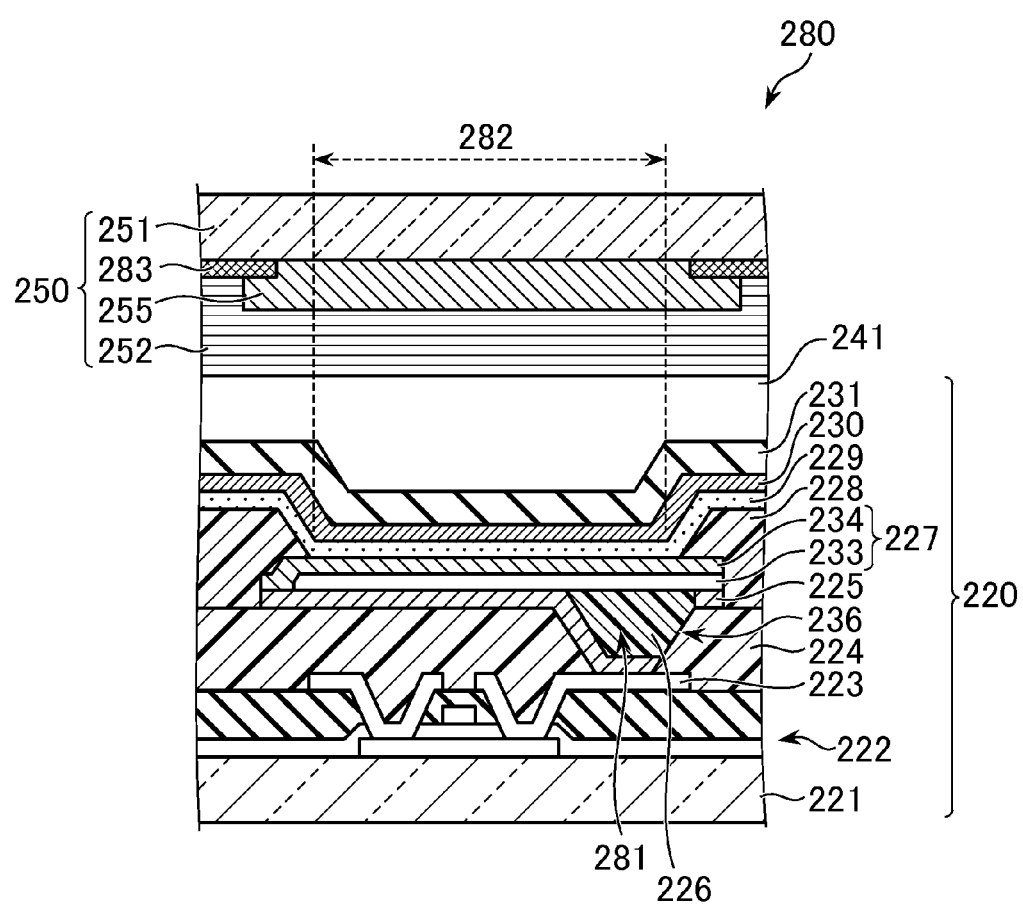
FIG. 6 is a diagram illustrating a first modification of the first embodiment in the same viewing field as that of FIG. 5.
Figure 7:
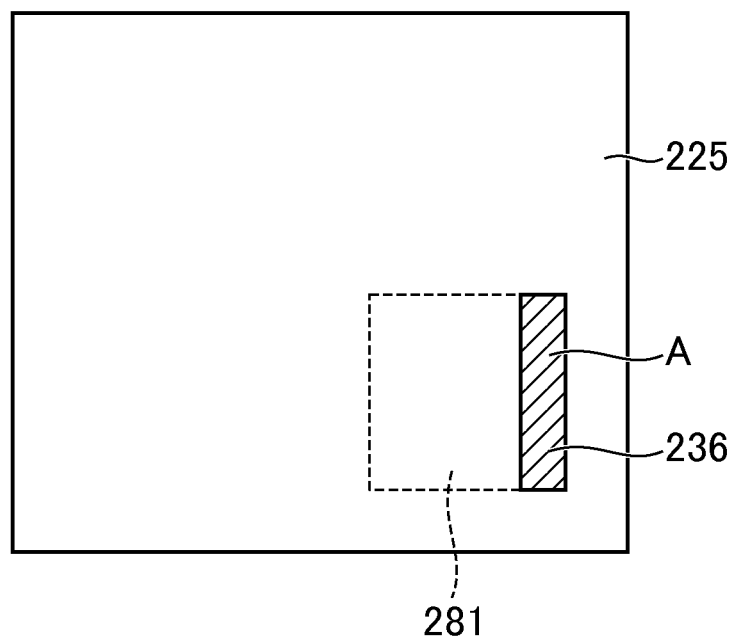
FIG. 7 is a plan view illustrating a film formation shape of a contact electrode in FIG. 6.

FIG. 6 is a diagram illustrating a first modification of this embodiment in the same viewing field as that of FIG. 5. A difference from FIG. 5 resides in that the contact electrode 225 has an opening portion 236 in a slope surface of the contact hole 281, and the contact hole planarization film 226 comes in contact with the planarization film 224 in the opening portion 236. FIG. 7 is a plan view illustrating a film formation shape of the contact electrode 225 in FIG. 6. As illustrated in FIG. 7, the contact electrode 225 is formed so that the opening portion 236 is provided on the contact hole 281, and in an area A of that portion, the contact hole planarization film 226 comes in contact with the planarization film 224.

In general, an organic insulating material contains moisture, and the moisture causes the deterioration of the light emitting layer to be promoted. For that reason, a bake process for removing the moisture contained in the organic insulating material including the contact hole planarization film 226 is provided before the organic layer 229 which is a light emitting layer is formed. However, in a state where the contact hole planarization film 226 is sealed by the lower electrode 227 which is made of an inorganic material, an exit of the moisture is lost, to thereby lead to a risk that the lower electrode 227 is peeled off due to the moisture which is to go out to the external in the bake process. Therefore, with the provision of the opening portion 236 illustrated in FIGS. 6 and 7, the moisture contained in the contact hole planarization film 226 can be released from the opening portion 236 in the bake process. Also, with the removal of the moisture, the reliability against the deterioration of the light emitting layer is enhanced, and also since the contact electrode 225 and the lower electrode 227 come in contact with each other by the conductive material, the organic EL display device 100 in which the electric connection is sufficient, and the light emitting area in each pixel is enlarged can be provided.

Figure 8:
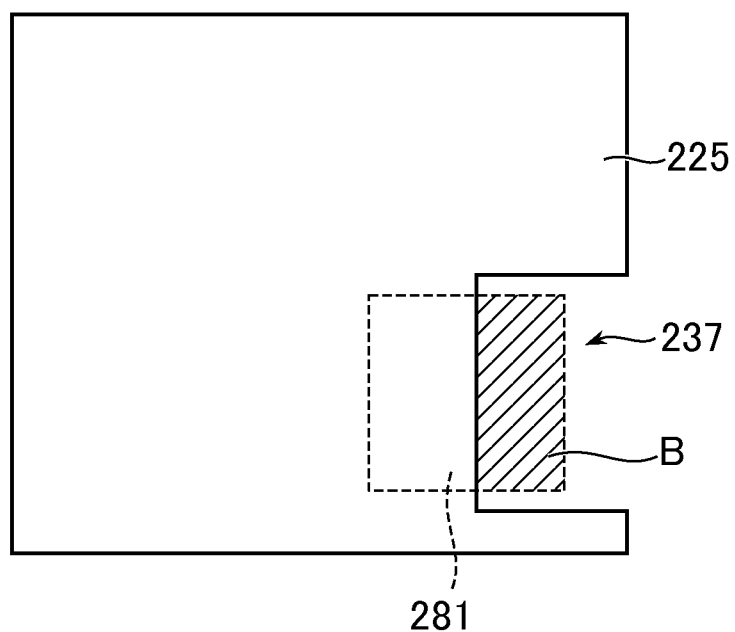
FIG. 8 is a plan view illustrating a different example of the film formation shape of the contact electrode in FIG. 7.

FIG. 8 is a plan view illustrating a different example of the film formation shape of the contact electrode 225 in FIG. 7. Referring to FIG. 7, the opening portion 236 is formed in a part of the contact electrode 225. In this example, the contact electrode 225 is shaped to have a notch portion 237 in which a part of the contact electrode 225 which overlaps with the contact hole 281 is notched. In this case, an area B in which the notch portion 237 of the contact electrode 225 overlaps with the contact hole is a portion in which the contact hole planarization film 226 comes in contact with the planarization film 224.

Figure 9:
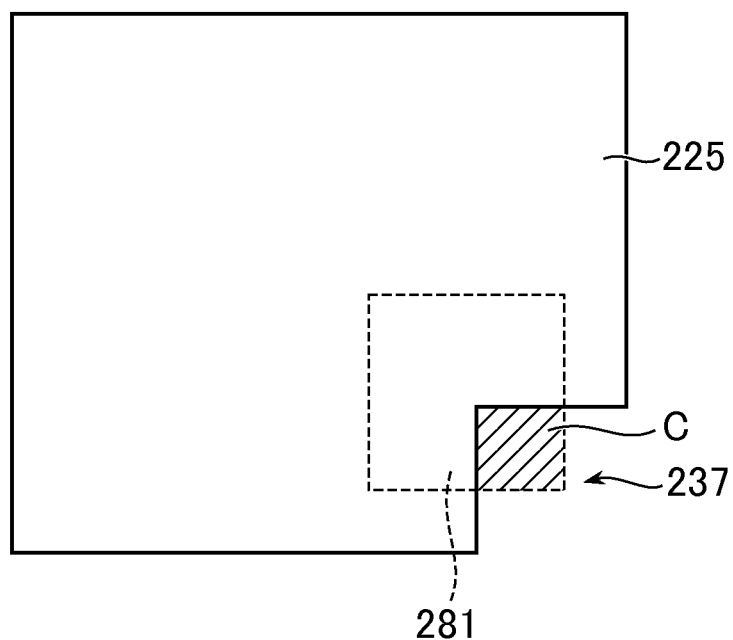
FIG. 9 is a plan view illustrating another different example of the film formation shape of the contact electrode in FIG. 7.

FIG. 9 is a plan view illustrating another different example of the film formation shape of the contact electrode 225 in FIG. 7. In this example, the contact electrode 225 is shaped to have a notch portion 237 in which a corner portion in a part of the contact electrode 225 which overlaps with the contact hole 281 is notched. In this case, an area C in which the notch portion 237 of the contact electrode 225 overlaps with the contact hole is a portion in which the contact hole planarization film 226 comes in contact with the planarization film 224. Even in this case, the same effects as those in FIGS. 6 and 7 can be obtained.

Figure 10:
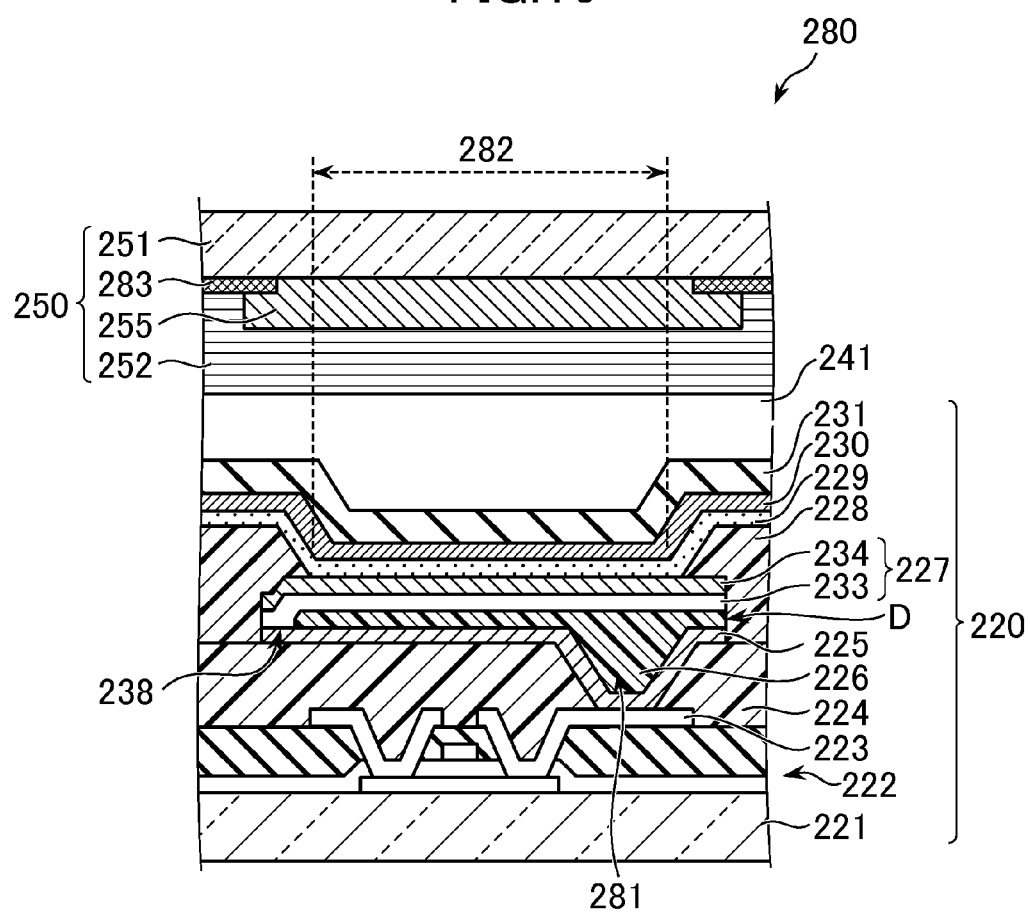
FIG. 10 is a diagram illustrating a second modification of the first embodiment in the same viewing field as that of FIG. 5.

FIG. 10 is a diagram illustrating a second modification of this embodiment in the same viewing field as that of FIG. 5. A difference from FIG. 5 resides in that the contact hole planarization film 226 is thickly formed so that not only the contact hole 281 is embedded with the contact hole planarization film 226, but also the contact hole planarization film 226 comes in contact with an upper surface of the contact electrode 225 formed other than the contact hole 281 to provide a contact portion D that comes in contact with the pixel separation film 228. The contact electrode 225 has a contact portion 238 in which the contact hole planarization film 226 is not formed for the purpose of making contact with the lower electrode 227.

Figure 11:
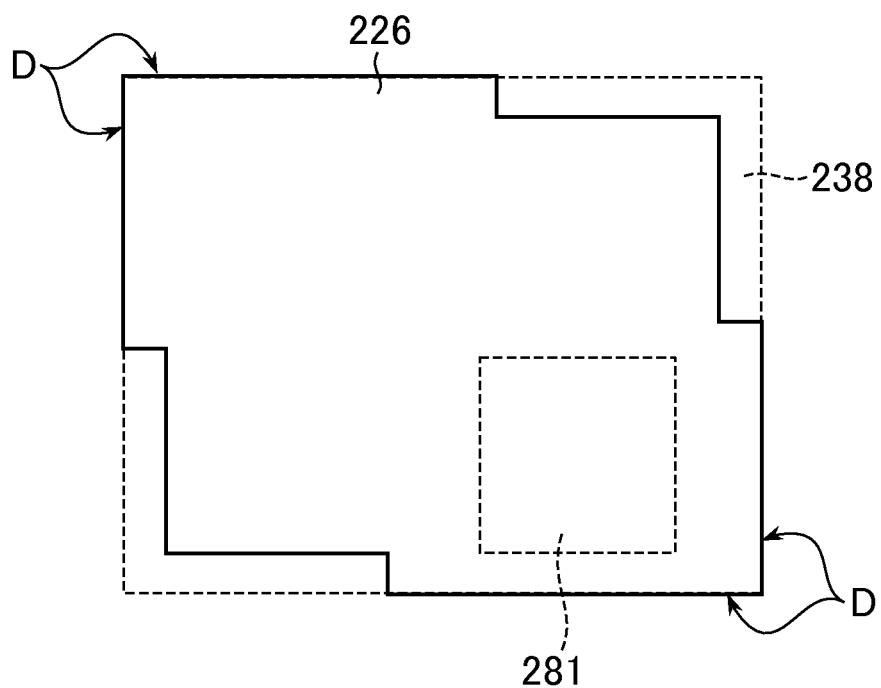
FIG. 11 is a plan view illustrating a film formation shape of a contact hole planarization film.

FIG. 11 is a plan view illustrating a film formation shape of the contact hole planarization film 226. As illustrated in FIG. 11, the contact hole planarization film 226 is so formed as to cover not only the contact hole 281, but also the contact electrode 225 except for the contact portion 238 in which the contact electrode 225 comes in contact with the lower electrode 227. With the contact hole planarization film 226 thus formed, the contact electrode 225 can be electrically connected to the lower electrode 227, and also form a contact portion D with the pixel separation film 228. Therefore, even in the second modification, the same effects as those in the first modification can be obtained.

(Second Embodiment)

Subsequently, an organic EL display device according to a second embodiment of the present invention will be described. The overall configurations of the organic EL display device and an organic EL panel according to the second embodiment are identical with those of the organic EL display device 100 and the organic EL panel 200 according to the first embodiment illustrated in FIGS. 1 to 3, and therefore a repetitive description will be omitted.

Figure 12:
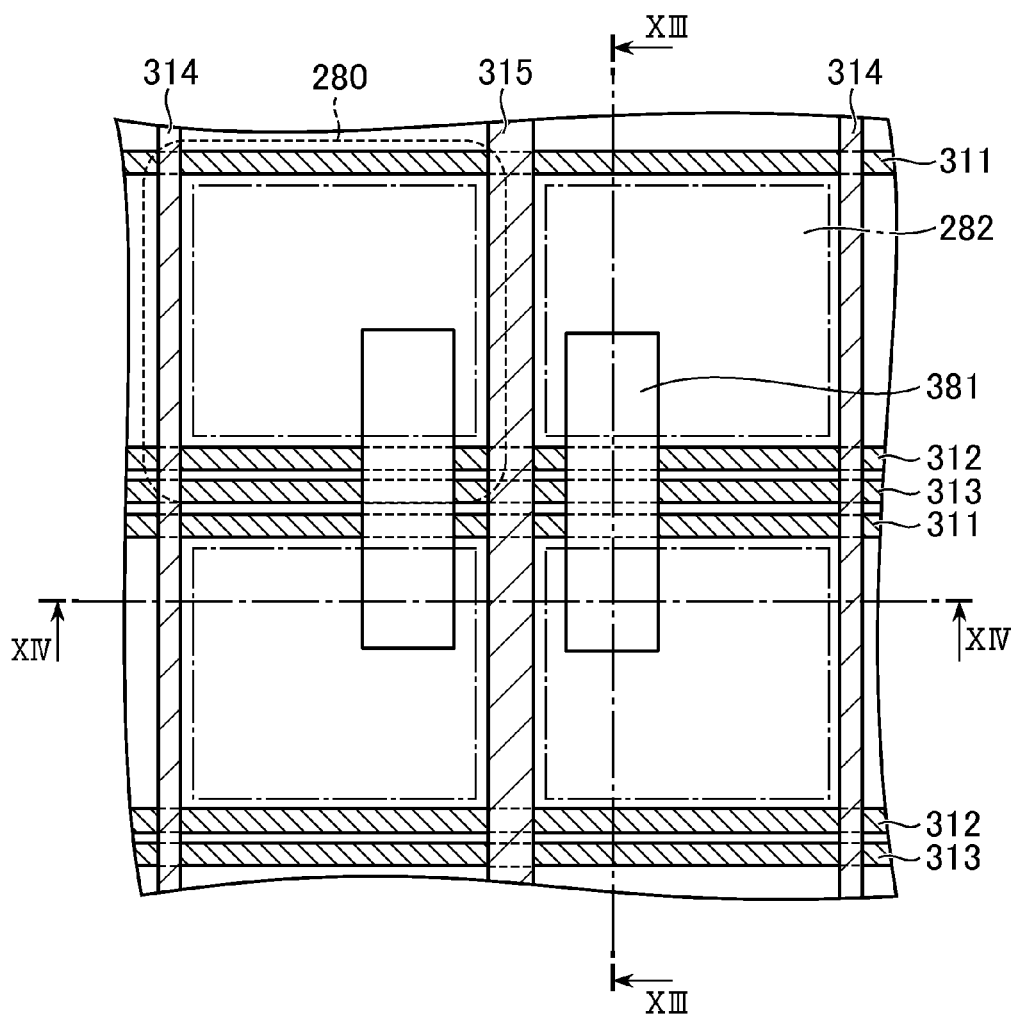
FIG. 12 is a diagram illustrating four sub-pixels included in each pixel of FIG. 3 according to a second embodiment.

FIG. 12 is a diagram illustrating the four sub-pixels 280 configuring the pixel of FIG. 3 according to the second embodiment, which illustrates contact holes 381 according to this embodiment. As illustrated in FIG. 12, the light emitting area 282 of each sub-pixel 280 is surrounded by a scanning line 311, a first control line 312, and a second control line 313 which extend in a horizontal direction, and a signal line 314 and a power line 315 which extend in a vertical direction. The contact holes 381 are coupled with each other in the pixels adjacent to each other in the vertical direction cross the scanning line 311, the first control line 312, and the second control line 313.

Figure 13:
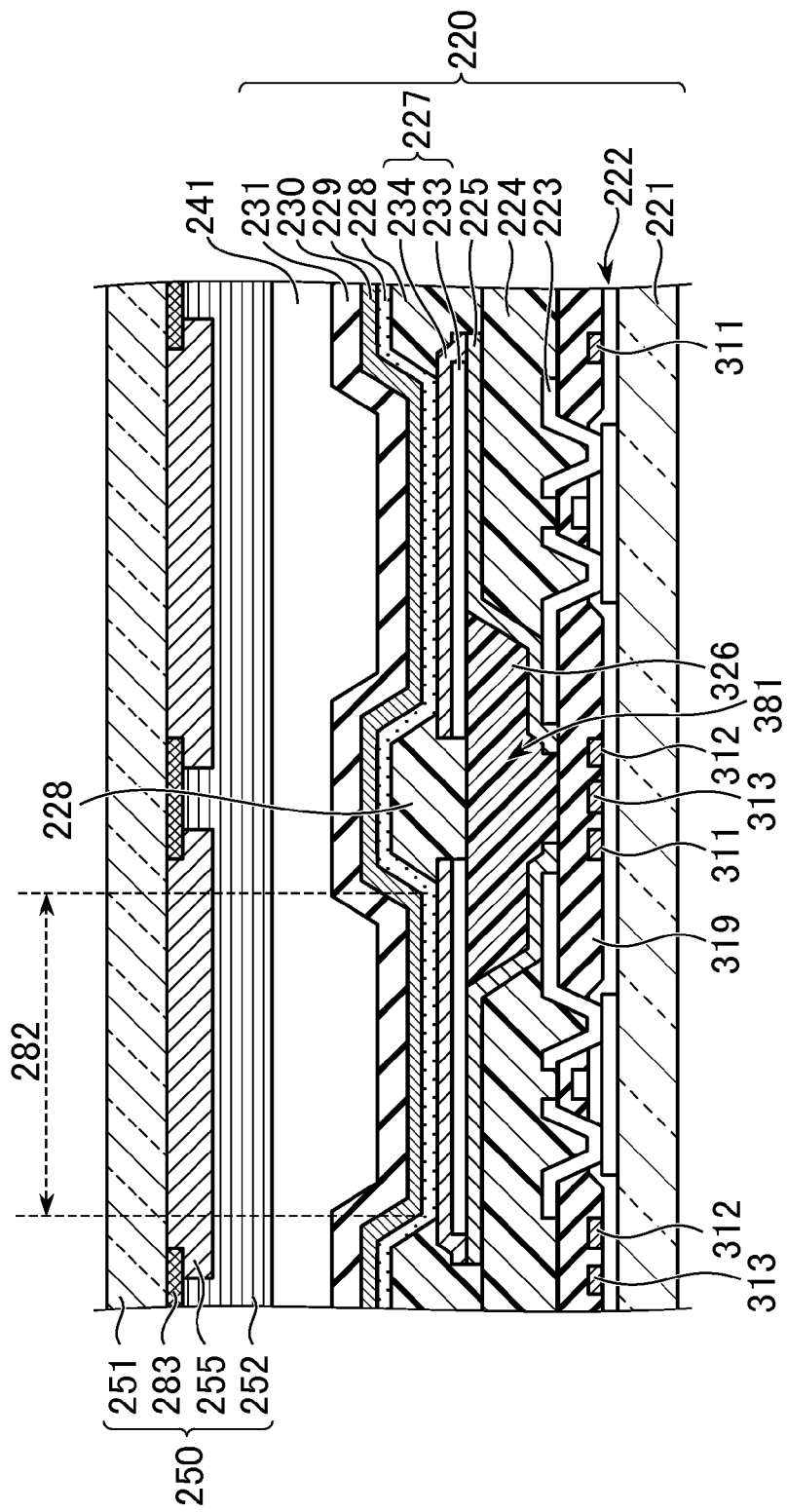
FIG. 13 is a cross-sectional view taken along a line XIII-XIII in FIG. 12.

FIG. 13 is a cross-sectional view taken along a line XIII-XIII in FIG. 12. A difference from FIG. 5 in the first embodiment resides in that the contact holes 381 are coupled with each other in the adjacent sub-pixels 280, and contact hole planarization films 326 formed within the contact holes 381 are also coupled with each other. The contact holes 381 are coupled with each other in the adjacent sub-pixels 280 so that the contact hole planarization films 326 come in contact with the pixel separation film 228. With this configuration, the moisture in the contact hole planarization films 326 can be emitted in the bake process. Also, this embodiment can obtain the same effects as those in the first embodiment and the modification of the first embodiment. In this example, the scanning line 311, the first control line 312, and the second control line 313 which extend in the horizontal direction are formed under an interlayer insulating film 319 which is lower than the planarization film 224. For that reason, those lines 311, 312, and 313 are not affected by coupling the contact hole planarization films 326 with each other on the planarization film 224.

Figure 14:
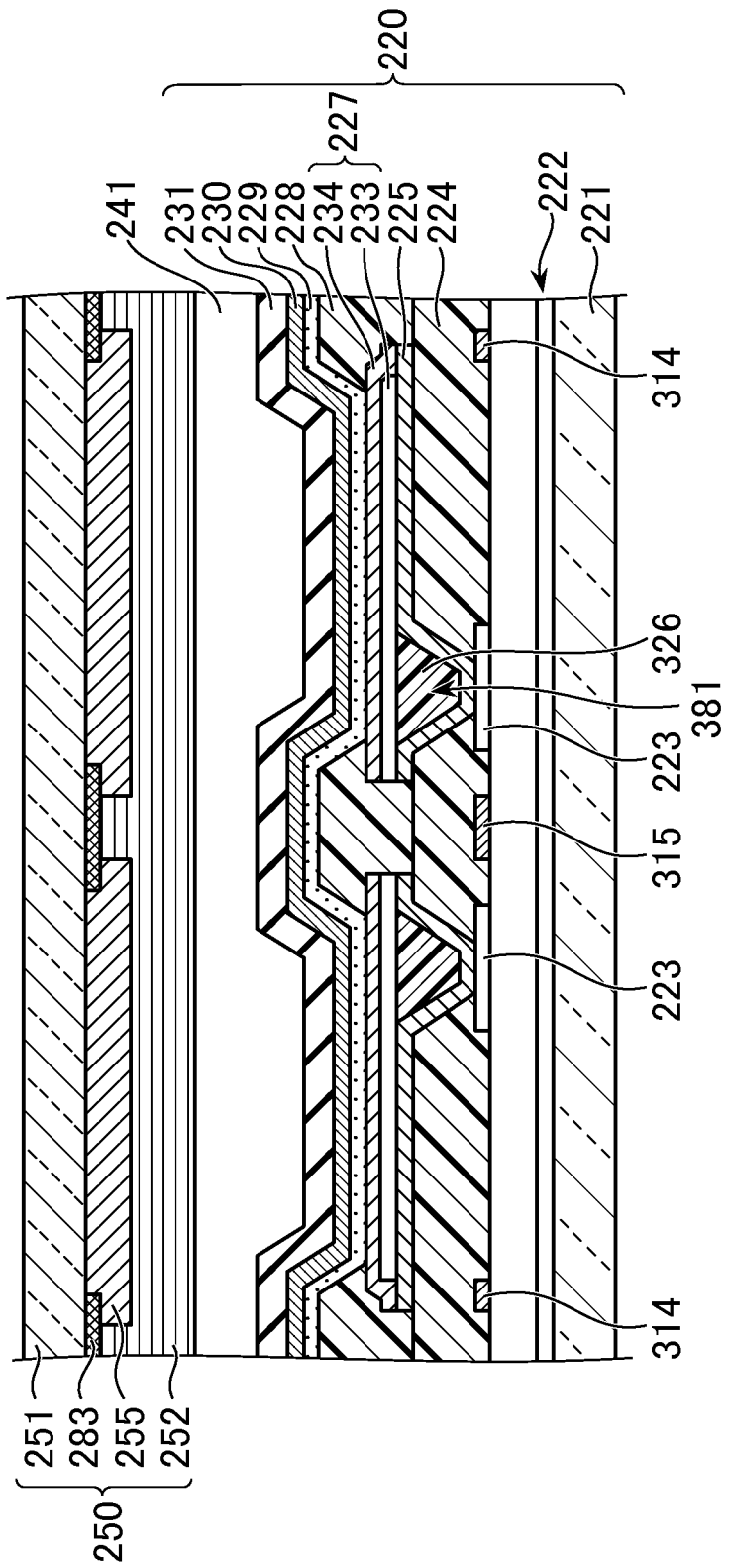
FIG. 14 is a cross-sectional view taken along a line XIV-XIV in FIG. 12.

FIG. 14 is a cross-sectional view taken along a line XIV-XIV in FIG. 12. In this cross-section, because the contact holes 381 are not coupled with each other in the adjacent sub-pixels 280, the contact holes 381 have the same shape as that in the cross-section of FIG. 5. The reason why the contact holes 381 are not coupled with each other is that since the power line 315 extending between the adjacent pixels is formed to come in contact with the planarization film 224 under the planarization film 224, if the contact holes 381 are coupled with each other in the same manner as that of FIG. 13 in the horizontal direction, the contact electrode 225 and the power line 315 come in contact with each other, or come too close to each other, resulting in a risk of short-circuiting. For that reason, the contact holes 381 are not coupled with each other so as to cross a direction along which the power line 315 that comes in contact with a lower surface of the planarization film 224 extends. However, if there is no risk of short-circuiting, the contact holes of three or more pixels may be coupled with each other.

Figure 15:
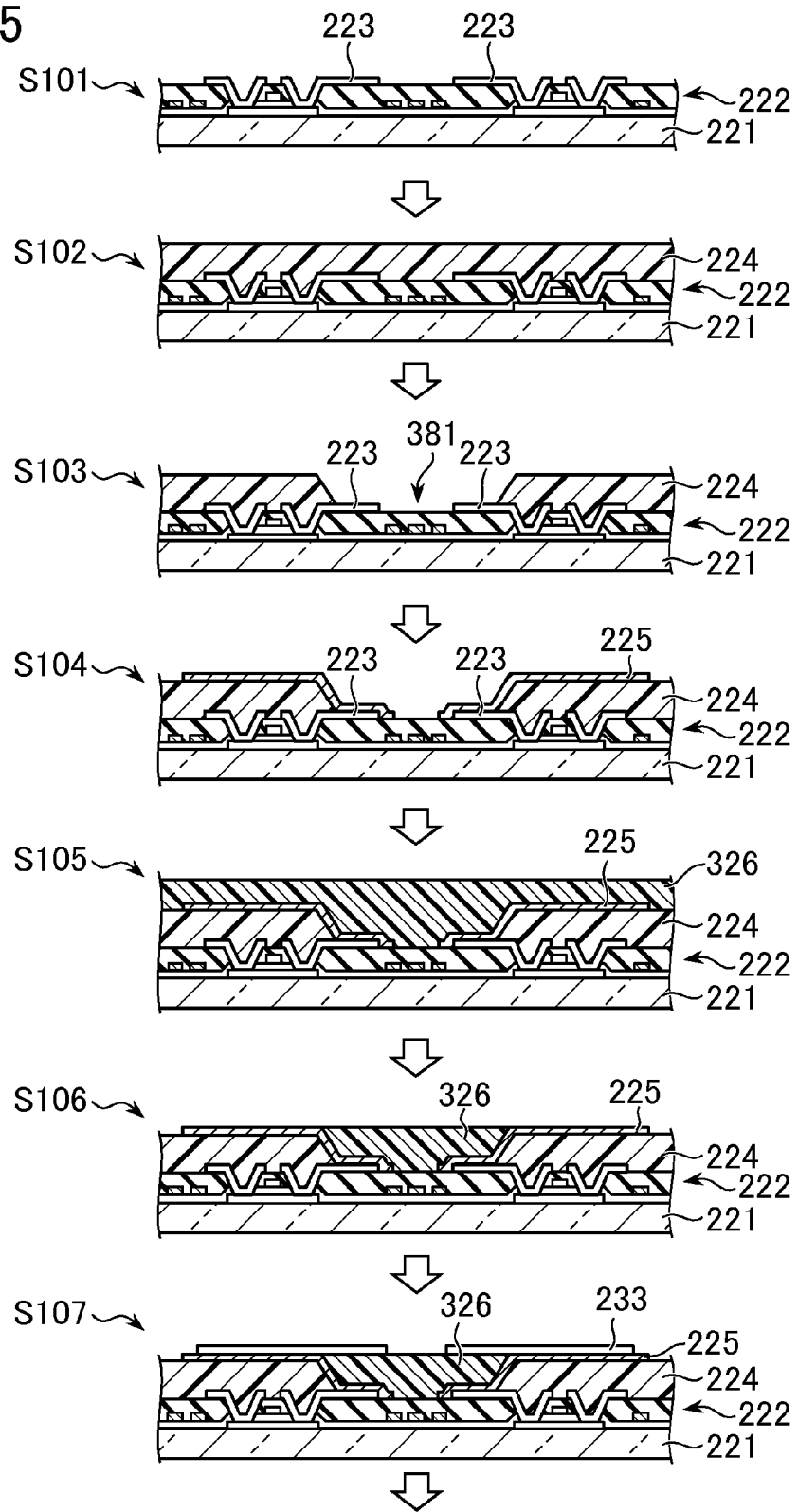
FIG. 15 is a flowchart illustrating a method of manufacturing an organic EL panel in the organic EL display device according to the second embodiment.
Figure 16:
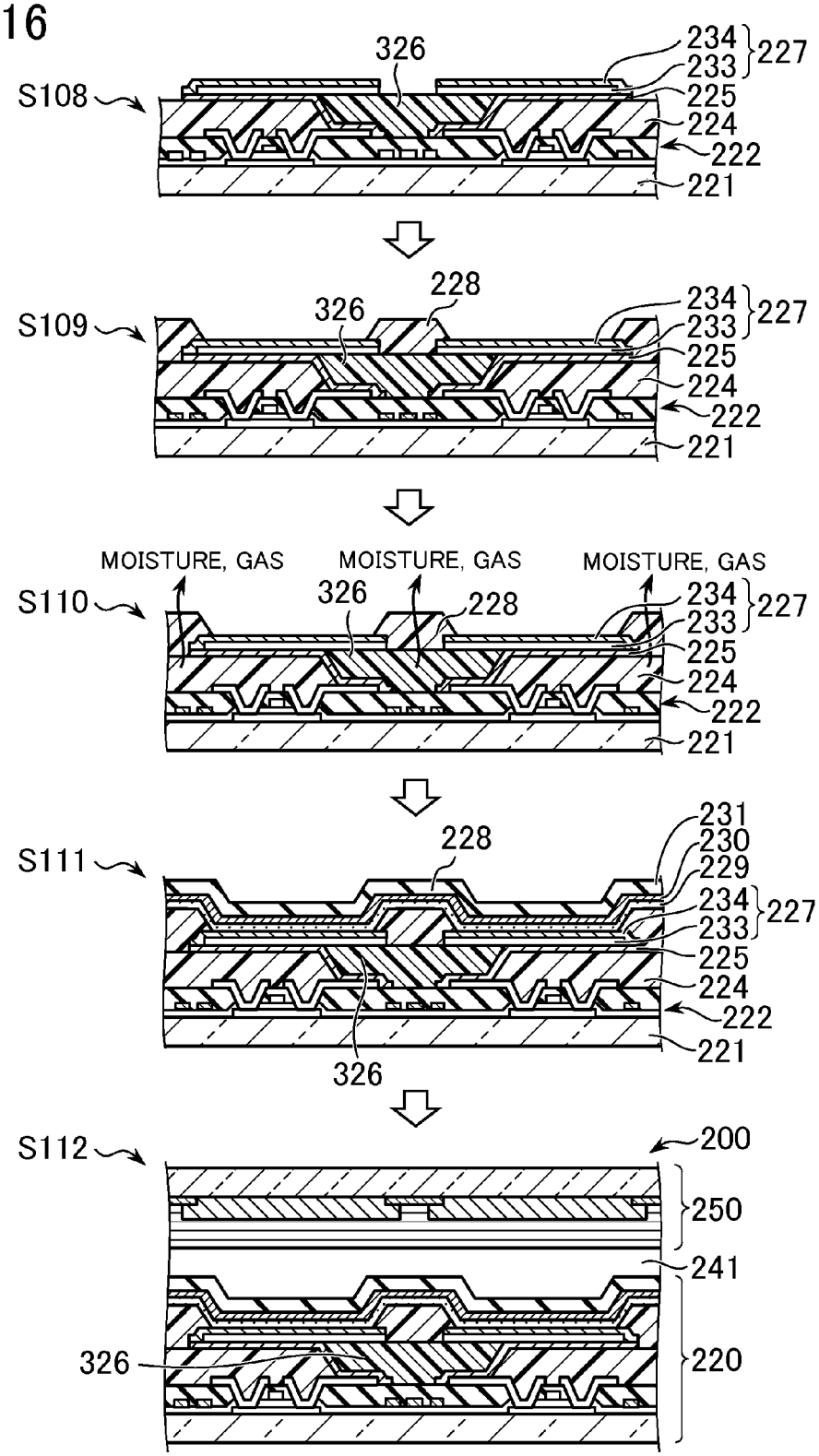
FIG. 16 is a flowchart illustrating the method of manufacturing the organic EL panel in the organic EL display device according to the second embodiment.

FIGS. 15 and 16 are flowcharts illustrating a method of manufacturing the organic EL panel in the organic EL display device according to the second embodiment. As illustrated in FIG. 15, a TFT circuit is first formed on the transparent insulating substrate 221 made of transparent glass or plastic to form the semiconductor circuit layer 222 (S101). The TFT circuit can be made of a known semiconductor such as LIPS semiconductor, amorphous semiconductor, or oxide semiconductor. Then, the planarization film 224 made of an organic insulating material is coated over the semiconductor circuit layer 222 (S102), and each contact hole 381 is so formed as to expose the source/drain electrodes 223 cross the adjacent pixels (S103). Subsequently, the contact electrode 225 is formed through a photolithography process so as to cover the exposed source/drain electrode 223 for each of the sub-pixels 280 (S104).

Thereafter, the contact hole planarization film 326 made of an organic insulating material is coated over the entire upper surface (S105), and the contact hole planarization film 326 is etched to expose the contact electrodes 225 so that the contact hole planarization film 326 becomes flush with the contact electrodes 225 (S106). Sequentially, the reflective films 233 made of Ag are formed on the contact electrodes 225 and the contact hole planarization film 326 so as to be independent of each other for each of the sub-pixels 280 (S107). The transparent electrode film 234 made of a transparent conductive material such as ITO is formed on the reflective film 233 so as to come in partial contact with the contact electrodes 225 (S108). In this example, the reflective film 233 and the transparent electrode film 234 configure the lower electrode 227.

Subsequently, the pixel separation film 228 made of an organic insulating material is formed (S109), and moisture and gas are removed through the bake process (S110). In this situation, the moisture and gas contained in the planarization film 224 and the contact hole planarization film 326 are emitted through the pixel separation film 228 that comes in contact with the planarization film 224 and the contact hole planarization film 326. Subsequently, the organic layer 229 formed of the light emitting layer that emits white light, the electron injection layer, and the hole transport layer, the upper electrode 230 made of a transparent conductive material such as ITO, and the sealing film 231 made of an inorganic insulating material such as SiO or SiN are formed in the stated order, to thereby complete the TFT substrate 220 (S111). Finally, the sealing substrate 250 adheres to the TFT substrate 220 with the transparent resin 241 to complete the organic EL panel 200 (S112). The organic EL panel 200 in the organic EL display device 100 according to the second embodiment can be manufactured through the manufacturing process described above.

Figure 17:
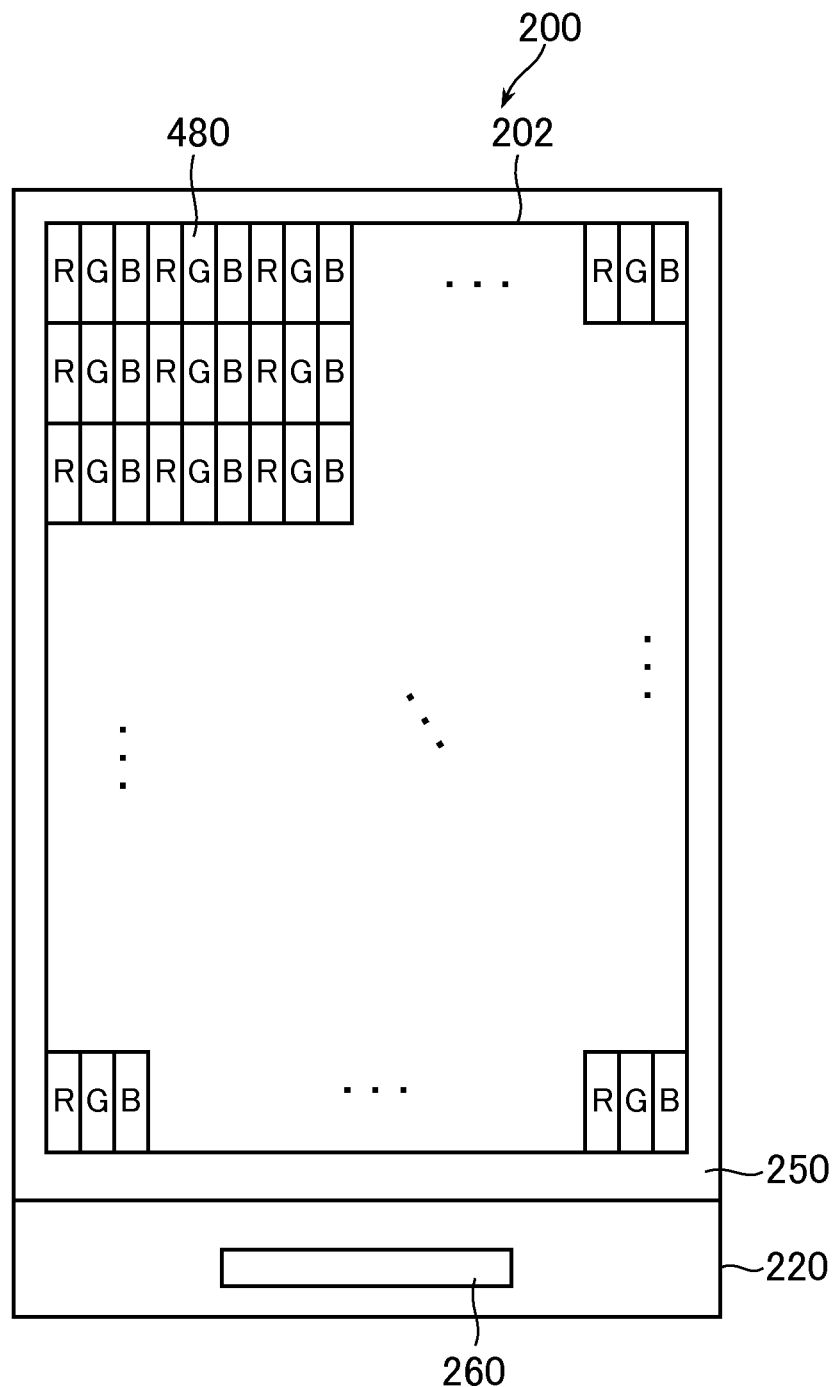
FIG. 17 is a diagram illustrating another pixel configuration in the organic EL panel of FIG. 1.

FIG. 17 illustrates another pixel configuration in the organic EL panel 200 of FIG. 1. Unlike the pixel configuration illustrated in FIG. 2, in the pixel configuration of FIG. 17, columns of sub-pixels 480 that emit a wavelength range of R, columns of the sub-pixels 480 that emit a wavelength range of G, and columns of the sub-pixels 480 that emit a wavelength range of B are aligned in the horizontal direction in sequence, and three sub-pixels 480 of RGB aligned in the horizontal direction are configured as one pixel. Each of the sub-pixels 480 may have an OLED that emits white light, and emit each color of RGB with the use of color filters. Alternatively, each of the sub-pixels 480 may use an OLED that emits light of two or more colors such as RGB. In this case, a configuration using no color filter may be applied.

Figure 18:
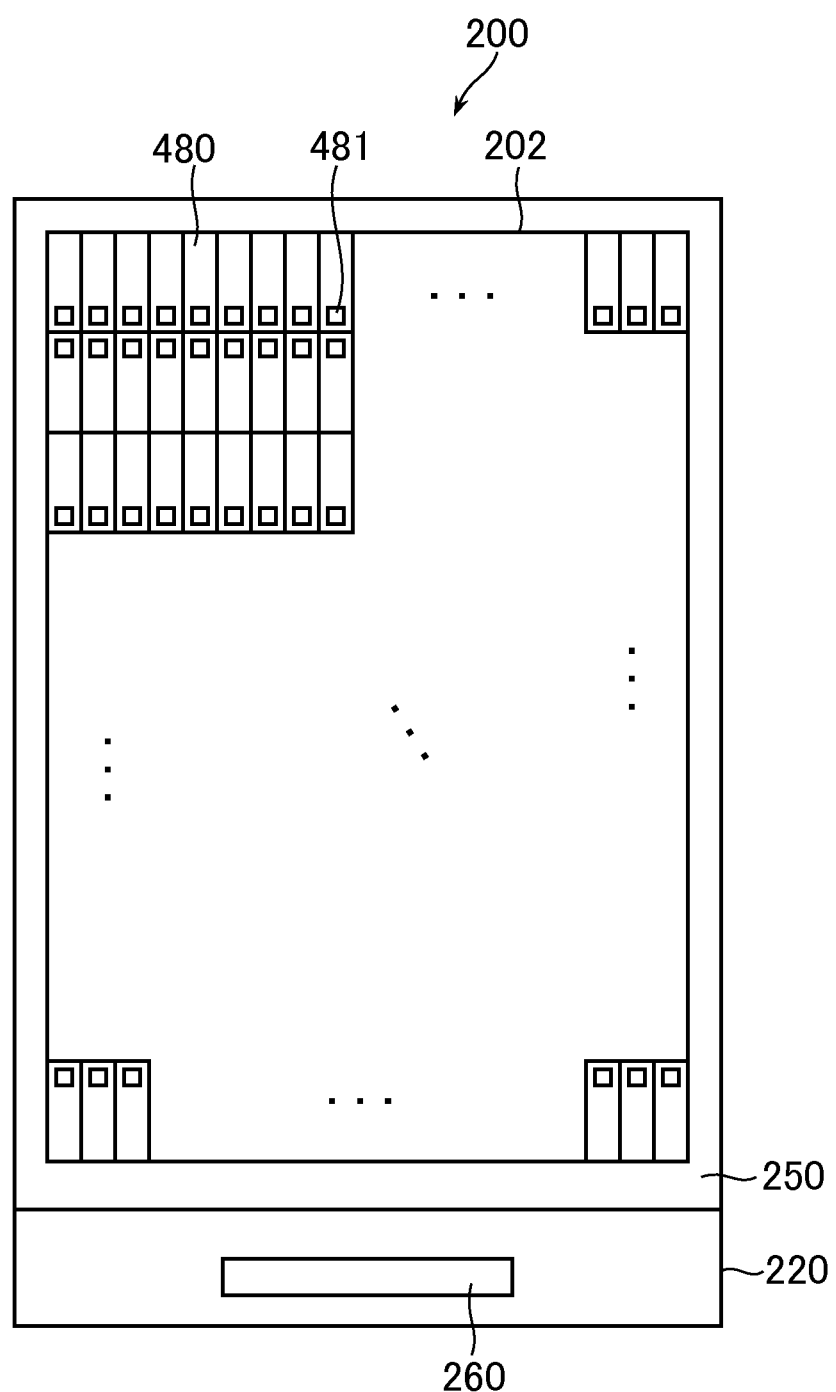
FIG. 18 is a diagram illustrating positions of the contact holes in the respective sub-pixels illustrated in FIG. 17.

FIG. 18 is a diagram illustrating positions of contact holes 481 in the respective sub-pixels 480 illustrated in FIG. 17. As illustrated in FIG. 18, the contact holes 481 of the respective sub-pixels 480 are disposed at a position close to a boundary between the respective pixels having the same color which are adjacent to the vertical direction. Even with the above arrangement, the configuration of the contact hole 281 and the contact hole planarization film 226 according to the first embodiment can be used. Also, when the adjacent contact holes 481 are combined with each other, the configuration of the contact holes 381 and the contact hole planarization film 326 according to the second embodiment can be used. Therefore, even in the pixel configuration illustrated in FIGS. 17 and 18, because the sub-pixel configurations according to the first embodiment and the second embodiment can be used, the same effects as those in the first embodiment, the modification of the first embodiment, and the second embodiment can be obtained.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An organic EL display device, comprising:
thin film transistors that are arranged in respective pixels which are arranged in a matrix and disposed in a display area;
a planarization film that is formed over the thin film transistor and made of an organic insulating material;
a contact electrode that is connected to a drain or a source of each of the thin film transistors through a contact hole formed within the planarization film, and made of a conductive material;
a contact hole planarization film that is arranged on the contact electrode, made of an organic insulating material and is embedded in the contact hole;
a lower electrode that is formed to be electrically connected to the contact electrode and formed on the contact hole planarization film;
an organic layer that is arranged on the lower electrode, and formed of a plurality of organic material layers including a light emitting layer that emits light; and
an upper electrode that is formed on the organic layer, and made of a conductive material,
wherein the contact hole planarization film is arranged between the contact electrode and the lower electrode, wherein the planarization film has an inner surface to define the contact hole, and
wherein the contact hole planarization film comes in contact with the inner surface.

2. The organic EL display device according to claim 1, wherein the lower electrode includes:
a reflective film that is formed on the contact hole planarization film, and reflects light emitted by the light emitting layer; and
a transparent electrode film that is formed over the reflective film, and made of a transparent conductive material.

3. The organic EL display device according to claim 1,
wherein each of the contact holes is coupled with the contact holes of the adjacent pixels, and
wherein the contact hole planarization film is integrated with the contact hole planarization films of the adjacent pixels.

4. The organic EL display device according to claim 3, further comprising:
control signal lines that extend along between the pixels in which the coupled contact holes are formed,
wherein the control signal lines are arranged at positions that come out of contact with the planarization film.

5. The organic EL display device according to claim 2,
wherein a part of the reflective film comes in contact with the contact electrode.

6. The organic EL display device according to claim 1,
wherein the inner surface includes a slope surface,
wherein the contact electrode has an opening portion which exposes a part of the slope surface, and
wherein the contact hole planarization film comes in contact with the slope surface through the opening portion.

7. The organic EL display device according to claim 1,
wherein the contact hole planarization film has a thickness only between the contact electrode and the lower electrode.

8. An organic EL display device, comprising:
thin film transistors that are arranged in respective pixels which are arranged in a matrix and disposed in a display area;
a planarization film that is formed over the thin film transistors and made of an organic insulating material;
a contact electrode that is connected to a drain or a source of each of the thin film transistors through a contact hole formed within the planarization film, and made of a conductive material;
a contact hole planarization film that is arranged on the contact electrode, made of an organic insulating material, and is embedded in the contact hole;
a lower electrode that is formed to be electrically connected to the contact electrode, and formed on the contact hole planarization film;
an organic layer that is arranged on the lower electrode, and formed of a plurality of organic material layers including a light emitting layer that emits light;
an upper electrode that is formed on the organic layer, and made of a conductive material; and
a pixel separation film that covers an end of the lower electrode, is arranged between the respective pixels so as to expose a central part of the lower electrode, and is made of an organic insulating material,
wherein the contact hole planarization film is arranged between the contact electrode and the lower electrode,
wherein the contact electrode and the lower electrode expose an end of the contact hole planarization film, and
wherein the end of the contact hole planarization film comes in contact with the pixel separation film.

9. The organic EL display device according to claim 8,
wherein the lower electrode includes:
a reflective film that is formed on the contact hole planarization film, and reflects light emitted by the light emitting layer; and
a transparent electrode film that is formed over the reflective film, and made of a transparent conductive material.

10. The organic EL display device according to claim 9,
wherein a part of the reflective film comes in contact with the contact electrode.

11. The organic EL display device according to claim 8,
wherein the contact hole planarization film has a thickness only between the contact electrode and the lower electrode.

12. The organic EL display device according to claim 8,
wherein the contact hole planarization film has a first surface, a second surface, and a side surface,
wherein the first surface comes in contact with the contact electrode,
wherein the second surface comes in contact with the lower electrode,
wherein the side surface connects the first surface and the second surface,
wherein the contact electrode and the lower electrode are arranged so as to expose the side surface, and
wherein the side surface comes in contact with the pixel separation film.

* * * * *